United States Patent [19]
Brekelmans

[11] Patent Number: 6,151,488
[45] Date of Patent: Nov. 21, 2000

[54] MULTI-TUNER RECEIVER FOR CONCURRENT RECEPTION OF MUTUALLY DIFFERENT SIGNALS

[75] Inventor: Johannes H. A. Brekelmans, Singapore, Singapore

[73] Assignee: U.S. Philips Corporation, New York, N.Y.

[21] Appl. No.: 09/006,967

[22] Filed: Jan. 14, 1998

[30] Foreign Application Priority Data

Jan. 15, 1997 [SG] Singapore ................................ 9700083

[51] Int. Cl.[7] ......................................................... H04B 1/10
[52] U.S. Cl. ................................. 455/150.1; 455/180.1; 455/191.1; 455/335
[58] Field of Search ............................. 455/150.1, 180.1, 455/180.2, 188.1, 191.1, 335, 340; 348/564, 565

[56] References Cited

U.S. PATENT DOCUMENTS

| | | | |
|---|---|---|---|
| 4,418,428 | 11/1983 | Evans | 455/340 |
| 4,661,998 | 4/1987 | Yamashita et al. | 455/315 |
| 4,726,072 | 2/1988 | Yamashita et al. | 455/340 |
| 4,736,457 | 4/1988 | Kupfer | 455/340 |
| 5,122,878 | 6/1992 | Heigl et al. | 455/180.1 |
| 5,285,284 | 2/1994 | Takashima et al. | 348/731 |
| 5,355,532 | 10/1994 | Kubo et al. | 455/301 |
| 5,438,372 | 8/1995 | Tsumori et al. | 348/565 |
| 5,729,300 | 3/1998 | Ahn | 348/564 |
| 5,790,204 | 8/1998 | Yamaguchi et al. | 348/564 |

*Primary Examiner*—Daniel S. Hunter
*Assistant Examiner*—Thuan T. Nguyen
*Attorney, Agent, or Firm*—Bernard Franzblau

[57] ABSTRACT

In a receiver, two tuners (TUN1,TUN2) provide concurrent reception of mutually different signals. The two tuners are merged into one module (MOD). This may give rise to mutual interference. However, there are various cost-efficient measures to counter such mutual interference. One such measure is that an oscillation frequency in either of the two tuners does not coincide with the radio frequency, or any sub-harmonic of the radio frequency, of the signal received by the respective other tuner.

16 Claims, 6 Drawing Sheets

MULTI-TUNER RECEIVER FOR CONCURRENT RECEPTION OF MUTUALLY DIFFERENT SIGNALS

FIELD OF THE INVENTION

This invention relates to a receiver comprising at least two tuners for concurrent reception of mutually different signals. The invention also relates to a multimedia apparatus and an add-on card comprising such a receiver.

BACKGROUND ART

The Philips television (TV) set type 32PW9761 comprises two tuner modules for allowing a concurrent display of two mutually different TV programs. TV programs are broadcast at various respective radio frequencies in a range from, say, 45 MHz to 860 MHz. The broadcast TV programs enter the TV set via a radio frequency inlet and are supplied to the two tuner modules via a splitter in the TV set. Each of the two tuner modules has a shielded encasing which houses an oscillator and a mixer for converting a radio frequency to an intermediate frequency of, say, 40 MHz. The respective oscillators have adjustable oscillation frequencies. An oscillation frequency determines which radio frequency, and therefore which broadcast TV program, is converted to the 40 Mhz intermediate frequency for further processing so as to be displayed. If, for example, the oscillation frequency is 500 MHz, a TV program which is broadcast at a 460 MHz radio frequency is converted to the 40 MHz intermediate frequency and as a result can be displayed.

SUMMARY OF THE INVENTION

The invention seeks, inter alia, to provide a receiver of the type mentioned above which, with respect to the background art, allows of more cost-efficient implementations. claims 1 and 8 define receivers in accordance with the invention. claims 9, 10, 11 and 12 define a method of receiving, a multimedia apparatus, an add-on card and a single shielded encasing, respectively, all in accordance with the invention. Additional features which may be optionally used to implement the invention to advantage are defined in the dependent claims.

The invention takes the following aspects into consideration. Up to the present, the demand for receivers which can concurrently receive mutually different signals has been relatively low. To give an example, of the total number of TV sets sold, only a relatively small percentage has two tuners to provide, for example, a picture-in-picture (PIP) function. For that reason, it is cost-efficient at present to implement PIP TV sets in a background-art manner. That is, two separate tuner modules are used which are also applicable individually in many other types of TV sets and, are produced in relatively large quantities, which means that they are relatively cheap.

However, the situation may be different in the future. The amount of information and entertainment offered to consumers is increasing rapidly. This also increases the number of ways in which information and entertainment is offered, for example, transmitted in an analog or digital form via satellite, cable TV networks, telephone networks, etc. Furthermore, multimedia tends to centralize various types of information like text, data, audio and visual information. In view of the above, the demand for receivers which can receive mutually different signals simultaneously may increase to such a level that solutions other than the background-art solution may be more cost-efficient.

In accordance with the invention, two or more tuners are merged into one module. If the two or more tuners are merged, various components may be shared by the two or more tuners such as, for example, crystals, integrated circuits, printed wire boards, metalware, connectors, and pin blocks. Costs which will be saved if various components are shared may outweigh costs related to merging the two or more tuners into one module once the demand for receivers of the type under discussion is sufficiently high.

The invention and additional features, which may be optionally used to implement the invention to advantage, will be apparent from and elucidated with reference to the drawings described hereinafter.

DETAILED DESCRIPTION OF THE DRAWINGS

First, as to the use of reference symbols, similar items will be denoted with identical letter codes throughout the drawings. In a single drawing, various similar items may be shown. In that case a numeral will be added to the letter code to distinguish these items from each other. Furthermore, if an item forms part of a higher-order item, the numeral in the reference sign of the entity will indicate that it belongs to the higher-order item which has the same numeral in its reference symbol. In the description, and in the claims, any numeral in a reference symbol may be omitted if this is appropriate.

Figure 1:
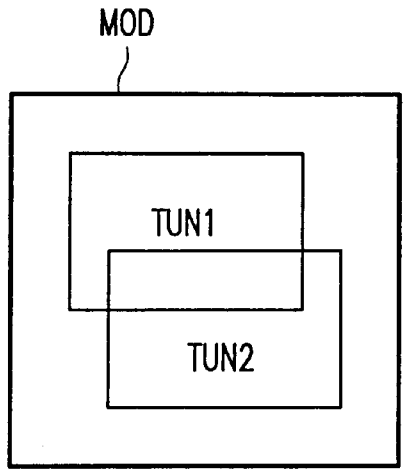
FIG. 1 is a block diagram illustrating the basic principle of the invention.

FIG. 1 illustrates the basic principle of the invention. In FIG. 1, at least two tuners TUN1,TUN2 are merged into one module MOD. Although FIG. 1 shows two tuners TUN1, TUN2, further tuners may be merged into the same module MOD.

Figure 2:
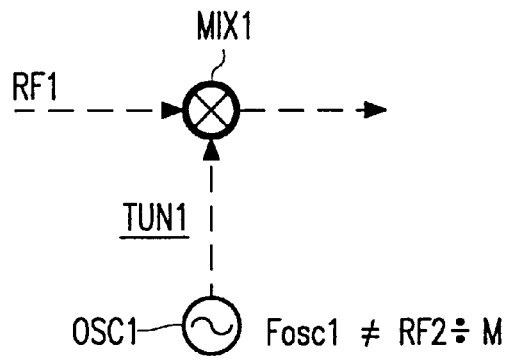
FIG. 2 to 7 are diagrams illustrating additional features which may be optionally used to implement the invention to advantage.
Figure 2:
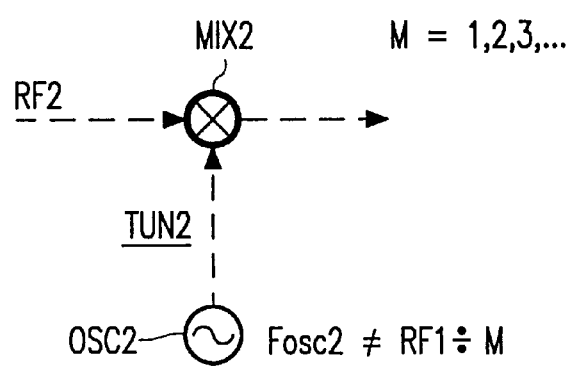

FIG. 2 illustrates that each of the two tuners TUN1,TUN2 has an oscillator OSC coupled to a mixer MIX for converting a signal at a radio frequency to an intermediate frequency. FIG. 2 also illustrates the following additional feature. The oscillator of each of the two tuners has an oscillation frequency, Fosc1 or Fosc2, which does not coincide with the radio frequency, RF2 or RF1 or any sub-harmonic of the radio frequency of the signal received by the respective other tuner. This preferably applies substantially throughout respective tuning ranges of the two tuners TUN1,TUN2.

The FIG. 2 feature is based on the following considerations. The two tuners TUN1,TUN2 which are merged into one module may interfere with each other. In particular, the oscillator of one of the two tuners may interfere with the signal received by the other tuner. An oscillator signal may propagate to various points in the receiver in many different ways. For example, it may propagate by means of induction in metal parts and by means of crosstalk into printed circuit board tracks which carry, for example, switching signals and variance voltages. The overall propagation attenuation which the oscillator signal experiences is often highly unpredictable and, moreover, it may vary strongly as a function of frequency. This is an important fact, since the oscillator signal may not only comprise a fundamental frequency component but harmonic frequency components as well. The amplitude of a harmonic frequency component may therefore be higher than that of the fundamental frequency component at certain points in the receiver.

There are various ways to counter the above mutual interference. One solution could be to keep oscillator signals at sufficiently low levels. However, if an oscillator signal level is reduced, this will generally degrade performance in terms of noise and frequency stability.

Another solution could be to shield the oscillators electromagnetically. However, shielding is relatively expensive and, in some cases, it may even be insufficiently effective. The following example is given as an illustration. In TV reception, an interference separation of at least 60 dB is desirable. Assuming that the level of a TV signal received by a tuner is 1 mV, which is a typical value, the level of an interfering signal may not exceed 1 $\mu$V. Assuming that the level of the oscillator signal in another tuner is 1 V, which is a typical value, a 120 dB attenuation is needed between the two tuners. If the two tuners are merged into one module, any internal shielding for providing such attenuation, if feasible at all, will be costly and also difficult to design.

Yet another solution could be to block reception for radio-frequency combinations at which the two tuners TUN 1, TUN2 would mutually interfere. This may be achieved by means of, for example, a suitably programmed computer which controls the two tuners TUN1,TUN2. However, as also harmonic frequency components of oscillator signals need to be taken into account, it may be necessary to block reception for relatively many radio-frequency combinations. In that case, end users will be stuck with a relatively constrained variety of signals which can be received concurrently.

If the FIG. 2 feature is applied, neither the fundamental frequency component nor any harmonic frequency component of an oscillator signal in any of the two tuners TUN1 or TUN2 will interfere directly with the signal being received by the respective other tuner, TUN2 or TUN1. The oscillators OSC1,OSC2 are therefore allowed to operate at signal levels which provide a satisfactory performance in terms of noise and stability. What is more, this does not require any relatively elaborate shielding, nor does it require a blocking of reception for relatively many radio-frequency combinations. Thus the FIG. 2 feature contributes to quality and versatility of reception and cost-efficiency, either in combination or on its own.

The FIG. 2 feature will provide an additional advantage if a splitter is used to apply signals to the two tuners TUN1, TUN2 from a common terminal. In that case the splitter need not provide high attenuation between the two tuners TUN1, TUN2 in order to prevent mutual interference. For that reason the splitter may be realized with relatively few active components, or it may even be realized without any active components. Active components consume power and produce noise and distortion. Thus the FIG. 2 feature allows of a relatively power-efficient, noiseless and distortionless splitter. It should be noted that these advantages will also be obtained if two tuners are separate, as in the background art.

Figure 3A:
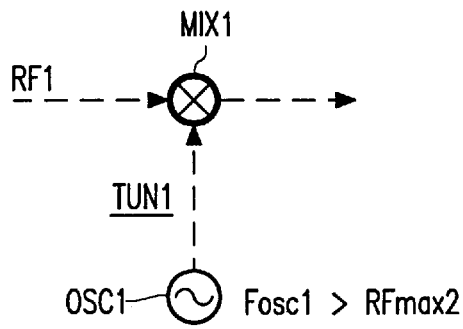
Figure 3A:
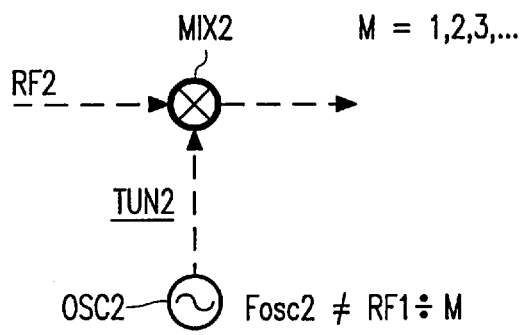

FIG. 3a illustrates the following additional feature. The oscillation frequency Fosc1 in tuner TUN1 exceeds the highest possible radio frequency RFmax2 which tuner TUN2 can receive. This preferably applies substantially throughout the tuning range of the tuner TUN1.

The FIG. 3a feature is based on the following considerations. If the tuner TUN1 needs to be tunable throughout a relatively wide tuning range, it may be difficult to avoid coincidence of the oscillation frequency Fosc1 with the radio frequency RF2, or any sub-harmonic of the radio frequency RF2, of the signal received by tuner TUN2. Relatively complicated and hence costly measures may be needed to avoid such coincidence. However, if the FIG. 3a feature is applied, any such coincidence will be excluded by definition. Thus, the FIG. 3a feature contributes to cost-efficiency, in particular if the tuner TUN1 needs to be tuned through a relatively wide tuning range.

Figure 3B:
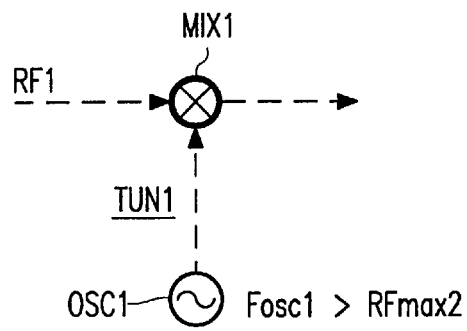
Figure 3B:
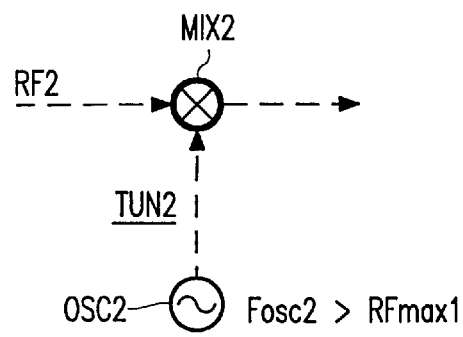

FIG. 3b illustrates the following additional feature. The oscillation frequency, Fosc1 or Fosc2, in each of the two tuners exceeds the highest possible radio frequency, RFmax2 or RFmax1, respectively, which the other tuner can receive. The FIG. 3b feature is effectively an addition to the FIG. 3a feature. The addition is that the oscillation frequency Fosc2 in tuner TUN2 also exceeds the highest possible radio frequency RFmax1 which tuner TUN1 can receive. Thus the FIG. 3b feature contributes to cost-efficiency, in particular if the two tuners TUN1,TUN2 both need to be tuned through a relatively wide tuning range.

The following remarks are made with respect to the FIGS. 3a and 3b features. When the FIG. 3a feature is applied, provisions may be made such that the tuner TUN1 receives the signal with the lower radio frequency and that consequently the tuner TUN2 receives the signal with the higher radio frequency. If, in addition, the oscillation frequency Fosc2 in the tuner TUN2 lies above the radio frequency RF2 of the signal received by this tuner, it will certainly exceed the radio frequency RF1 of the signal received by the tuner TUN1. The overall result will be that the oscillation frequency Fosc1 or Fosc2 in each of the two tuners will exceed the radio frequency RF2 or RF1, respectively, received by the other tuner. Consequently, neither the fundamental components nor any harmonic components of the oscillation signals can interfere with the signals received. Thus the FIG. 3a feature can provide advantages similar to those of the FIG. 3b feature.

Notwithstanding the above, the FIG. 3b feature may be preferable over the FIG. 3a feature for the following reason. Assuming that two signals S(X) and S(Y) are concurrently received, the signal S(Y) will have a higher radio frequency than signal S(X). The reception signal S(Y) needs to be discontinued in favour of a different signal S(Z) which has a lower radio frequency than S(X). The following will happen in the case of FIG. 3a with the provisions as described above. The tuner TUN2 will have to take over the reception of signal S(X), which is maintained, from the tuner TUN1. Such a take-over is needed in view of the higher-lower radio frequency relation. The take-over may cause an interruption in the reception of signal S(X). By contrast, however, no take-over will be needed if the FIG. 3b feature is applied. Thus the FIG. 3b feature allows of an uninterrupted reception while changing any concurrent reception.

Figure 4:
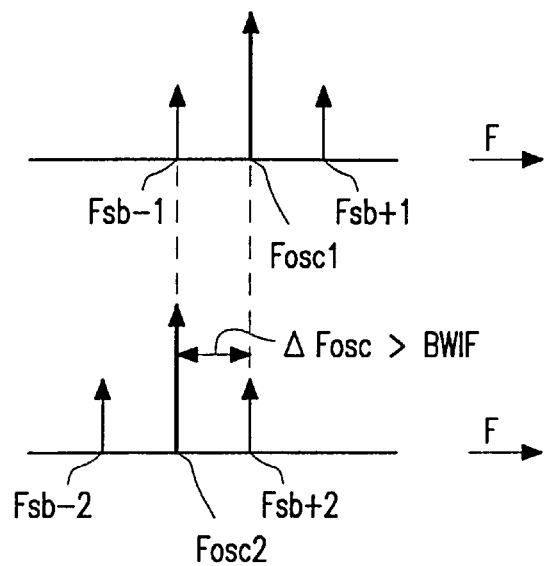

FIG. 4 illustrates the following additional feature. The difference $\Delta$Fosc between the oscillation frequencies Fosc1, Fosc2 in the two tuners TUN1,TUN2 exceeds an intermediate frequency bandwidth BWIF. This preferably applies substantially throughout the respective tuning ranges of the two tuners TUN1, TUN2.

The FIG. 4 feature is based on the following considerations. The oscillators OCS1,OSC2 may phase-modulate each other as a result of mutual electromagnetic coupling. This will cause the oscillator signals to have sidebands. FIG. 4 shows sidebands Fsb+1,Fsb−1 belonging to oscillator OSC1 and sidebands Fsb+2, Fsb−2 belonging to oscillator OSC2. The sidebands are located at +ΔFosc and −ΔFosc from the oscillation frequencies Fosc1,Fosc2. The sidebands of each oscillator signal will mix with the respective signal received. As a result, the signals received which have been converted to the respective intermediate frequencies, will also have sidebands located at +ΔFosc and −ΔFosc from these respective intermediate frequencies.

If the FIG. 4 feature is applied, these sidebands will not interfere directly with the respective signal received. Thus the FIG. 4 feature counters mutual interference between the two tuners TUN1,TUN2 which may arise as a result of mutual electromagnetic coupling of their oscillators. Consequently, there will be relatively little need to counter such mutual electromagnetic coupling with measures such as, for example, providing internal shielding or improving the quality Q of an oscillator tank circuit. Such measures are relatively costly, in particular at relatively high frequencies. Hence the FIG. 4 feature contributes to cost-efficiency.

The following additional remarks are made with respect to the FIG. 4 feature. The sidebands Fsb+, Fsb− could cause intermodulation products which may impair reception. However, the respective sidebands will generally have such a small amplitude that, in many cases, this form of mutual interference may be disregarded. Furthermore, the amplitude of the respective sidebands Fsb+,Fsb− will decrease as the difference ΔFosc between the oscillator frequencies Fosc1,Fosc2 increases.

When one of the two tuners TUN1,TUN2 is operated in an autosearch mode, it may be advantageous to skip a frequency range where mutual phase modulation can occur, e.g. by software measures. In that respect it should also be noted that any harmonics of the oscillation frequencies Fosc1,Fosc2 do not substantially contribute to any mutual phase modulation of the oscillators OSC1,OSC2. Thus there will be little or no mutual phase modulation if one of the oscillator frequencies, Fosc1 or Fosc2, is relatively close to a harmonic of the respective other oscillator frequency, Fosc2 or Fosc1. Consequently, if the frequency ranges of the oscillators OSC1,OSC2 do not overlap, any skip during an autosearch will not be necessary.

Figure 5A:
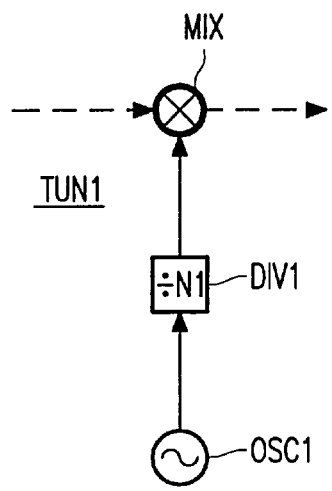

FIG. 5a illustrates the following additional feature. A frequency divider DIV1 is coupled between the oscillator OCS1 and the mixer MIX1 in the tuner TUN1. Before any advantages of this feature are discussed, the following should be noted. The frequency divider DIV1 generates a sub-harmonic of the oscillator signal. In principle, the sub-harmonic may interfere with the signal received by the tuner TUN2, not shown in FIG. 5a. Thus, the divider DIV1 and any circuitry coupling it to mixer MIX1 should be regarded as potentially interfering transmitters. However, with proper design, these potentially interfering transmitters will be appreciably weaker than the potentially interfering transmitter which the oscillator OSC1 would have been if the invention were not used. Consequently, the FIG. 5a feature does not stand in the way of a merging of two tuners in a manner which would not have been possible in the background art.

Figure 5B:
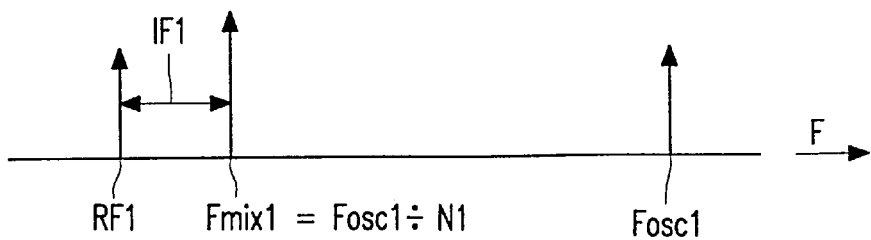

An advantage of the FIG. 5a feature will be explained with reference to FIG. 5b. FIG. 5b is a frequency diagram showing the radio frequency RF1, the oscillation frequency Fosc1, and a mixing frequency Fmix1. The mixing frequency Fmix1 is the oscillation frequency Fosc1 divided by N1, N1 being the division factor of the frequency divider DIV1. FIG. 5b also shows the intermediate frequency IF1 which is the difference between the mixing frequency Fmix1 and the radio frequency RF1.

Assuming that the intermediate frequency IFI preferably has a certain desired value, for example 40 MHz in the case of TV reception, an advantage of the FIG. 5a feature is as follows. It allows the oscillation frequency Fosc1 to be such that a mutual interference between the two tuners TUN1, TUN2, as described in the foregoing, can be countered by a suitable choice of the division factor N1 of the frequency divider DIV1. If, in addition, a frequency divider is also coupled between the oscillator OSC2 and the mixer MIX2 in the tuner TUN2, all shown in FIG. 1, this will provide a greater number of possibilities to counter mutual interference. The division factor of the latter divider introduces, as it were, an extra degree of freedom to achieve this.

The following additional remarks are made with respect to the FIG. 5a feature. The FIG. 5a feature is neither essential to the invention, nor is it essential to any of the other features described above. The oscillation frequency Fosc1 shown in FIG. 5b may be directly applied to the mixer MIX1 without any frequency division. However, in that case the intermediate frequency would be the difference between the oscillation frequency Fosc1 and the radio frequency RF1. Consequently, the intermediate frequency would be higher. Circuitry for processing relatively high intermediate frequency signals is relatively costly, power-consuming and/or critical. Consequently, because the FIG. 5a feature allows of a relatively low intermediate frequency, it provides cost-efficiency, energy-efficiency and robustness.

Figure 6:
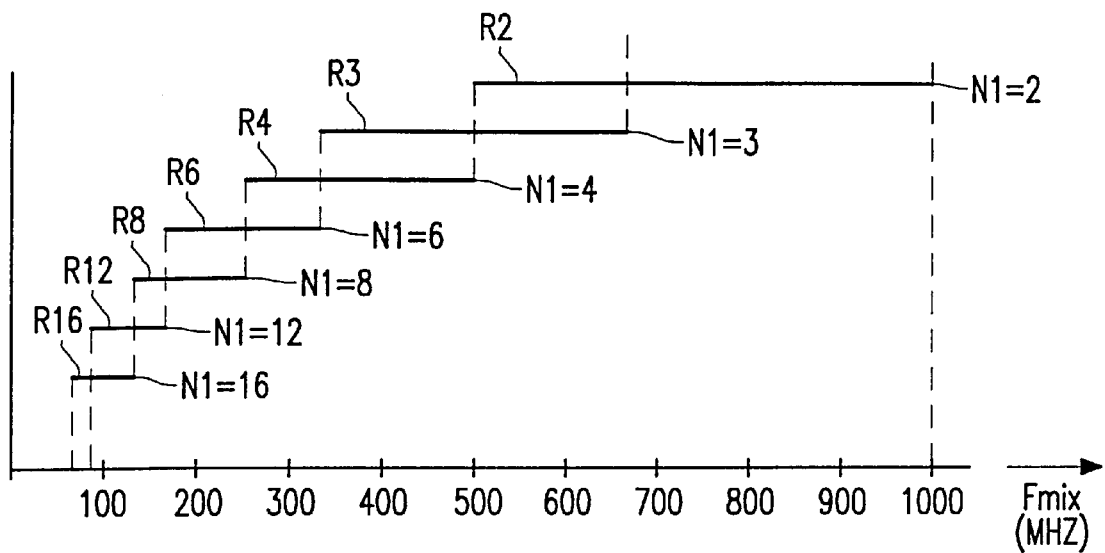

FIG. 6 illustrates the following additional feature. The division factor N1 of the frequency divider DIV1 shown in FIG. 5a is adjustable. FIG. 6 shows various mixing frequency ranges R2,R3,R4,R6,R8,R12,R16 obtained with division factors N1=2,3,4,6,8,12,16, respectively, if the oscillator OSC1 is tunable between 1000 and 2000 MHz. Thus, if the frequency divider DIV1 can be adjusted to have any of these division factors, it allows of the mixing of frequencies through a range from 62,5 MHz to 1000 MHz. If, however, the division factor N1 were fixed, the oscillator OSC1 would have to be tunable over a wider range, to allow a similar choice of mixing frequencies. This would make it more difficult, or even impossible, to realize the oscillator OSC1. As a solution, several tunable oscillators could be used, each tunable oscillator covering a certain portion of the range of mixing frequencies. This solution is common in TVs where, for example, oscillators are used for the bands VHF-low, VHF-high and UHF, respectively. The FIG. 6 feature, however, allows tuning through a relatively wide frequency range with a single oscillator which needs only to be tuned over a relatively narrow frequency range. Consequently, the FIG. 6 feature contributes to cost-efficiency.

FIG. 6 also illustrates the following advantageous additional feature. Over a substantial portion of the range of mixing frequencies, namely between 83.33 MHz and 666.67 Mhz, there is more than one oscillator frequency with which a certain mixing frequency can be obtained. In other words, there is a choice of oscillator frequencies for a certain mixing frequency. This choice allows the oscillator frequency Fosc1 in the tuner TUN1 to be relatively far removed from the oscillator frequency Fosc2 in the tuner TUN2, thereby countering mutual interference. It does not matter here if the oscillators OSC1,OSC2 operate in respective frequency ranges which overlap. A suitably chosen division factor N1 can prevent the oscillators OSC1,OSC2 from being too close together in frequency. Moreover, if an adjustable frequency divider is also coupled between the oscillator OSC2 and the mixer MIX2 in tuner TUN2, there will be an even greater choice in keeping the oscillation frequencies Fosc1,Fosc2 apart. Suitable software may be used to choose the optimal division factor, or division factors, in any given case.

In FIG. 6, two frequency ranges remain for which no choice in oscillation frequency exist, namely a frequency range below 83.33 MHz and a frequency range above 666.67 Mhz. Although it would be advantageous if there were a choice within these frequency ranges, any absence of choice will not lead to a noticeable mutual interference in most cases. First of all, two tuners generally need not receive simultaneously at the same radio frequency or almost the same radio frequency, in which case the respective oscillation frequencies Fosc1,Fosc2 would coincide or nearly coincide. Furthermore, it will hardly occur that two adjacent radio-frequency channels are occupied by usable signals and, therefore, the changes that a simultaneous reception over two adjacent radio-frequency channels is required are very slim. In the unlikely event that such a reception is needed, the oscillation frequencies Fosc 1,Fosc2 will be spaced apart by an amount which is N times the distance between the two adjacent radio-frequency channels, N being the identical division factor of the dividers DIV1,DIV2. Thus, as the oscillation frequencies Fosc1,Fosc2 are divided, they will be spaced apart comparatively widely, so that any sidebands will fall outside the intermediate frequency bandwidth as a result of mutual phase modulation, even if an identical division factor is used.

Figure 7:
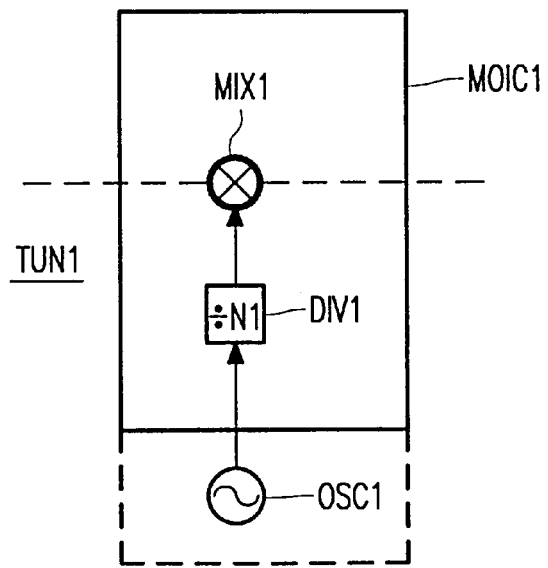

FIG. 7 illustrates the following additional feature. The mixer MIX1 and the frequency divider DIV1 form part of an integrated circuit MOIC1. Hence, the circuitry carrying the sub-harmonic Fosc1÷N1 of the oscillation signal has a small geometry. As a result, any radiation of the sub-harmonic Fosc1÷N1, which may potentially interfere with the signal received by the tuner TUN2, will be relatively modest. Consequently, the FIG. 7 feature enhances the extent to which the two tuners TUN1,TUN2 may be merged.

The following additional remarks are made with respect to the FIG. 7 feature. First of all, the mixer MIX1 is preferably implemented in the form of a balanced circuit. This provides an inherent suppression of any oscillator sub-harmonic residues at input and output ports of the mixer circuit MIX1. Preferably, the divider DIV1 is also implemented in the form of a balanced circuit. Secondly, it should be noted that the integrated circuit MOIC1 may comprise further circuits. The dotted lines in FIG. 7 illustrate that the oscillator OSC1 may be included wholly or partly in the integrated circuit MOIC1. If the tuner TUN2 also comprises a frequency divider coupled between the mixer MIX2 and the oscillator OSC2, these circuits may also form part of the integrated circuit MOIC1. As further example, the integrated circuit MOIC1 may also include a phase-lock loop circuit.

Figure 8:
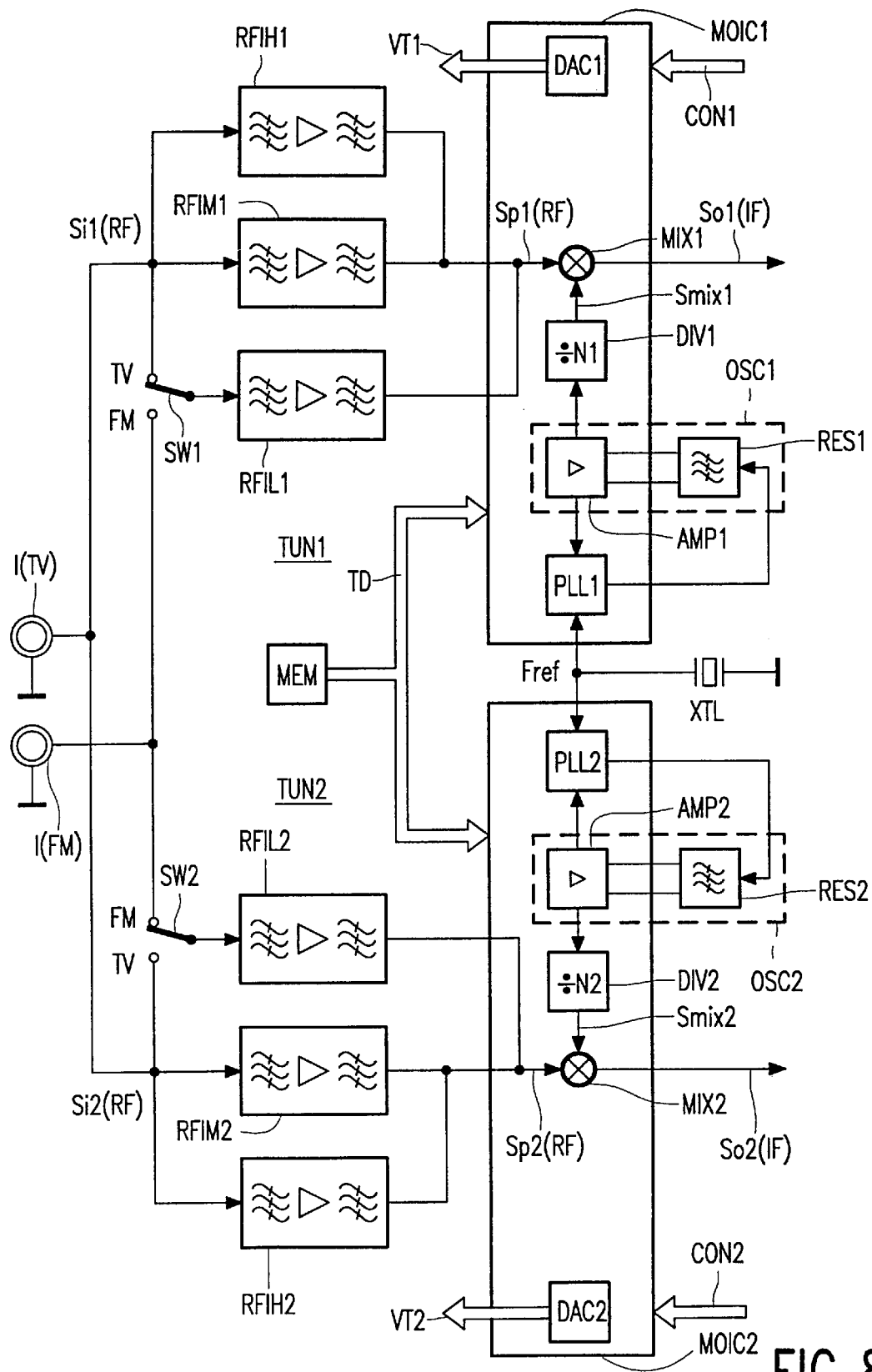
FIG. 8 is a block diagram of an example of a receiver in accordance with invention.

FIG. 8 shows an example of a receiver in accordance with the invention and including the additional features of FIGS. 2 to 7. The FIG. 8 receiver is a dual TV/FM receiver capable of concurrently receiving two mutually different TV stations, or two mutually different FM-radio stations, or a TV station and an FM-radio station. To that end, it comprises two tuners TUN1,TUN2 for concurrently converting two mutually different radio-frequency signals Si1(RF) and Si2 (RF) to intermediate frequency signals So1(IF) and So2 (IF2), respectively. Any of the radio-frequency signals Si1 (RF) and Si2(RF) may either be a TV station or an FM-radio station, received at radio-frequency inlets I(TV) and I(FM), respectively.

In FIG. 8, each of the two tuners TUN1,TUN2 includes a switch SW, three radio-frequency input circuits RFIL, RFIM and RFIH, and an integrated circuit MOIC. Radio-frequency input circuits RFIL, RFIM and RFIH are arranged for processing signals within a VHF-low band, a VHF-high band and a UHF band, respectively. Each of the integrated circuits MOIC houses a mixer MIX, a divider DIV and an amplifier portion AMP of an oscillator OSC. A resonator portion RES of the oscillator OSC is external to the integrated circuit MOIC. Each of the integrated circuits MOIC further houses a phase-lock loop circuit PLL and a digital-to-analog conversion arrangement DAC. The two tuners TUN1,TUN2 share a memory circuit MEM and a crystal XTL which resonates at a reference frequency Fref.

Each of the two tuners TUN1,TUN2 operates as follows. The switch SW is set to a position TV or a position FM, depending on whether reception of a TV station or an FM-radio station is desired. In the former case, a radio frequency signal Si(RF) may be processed in any of the three radio-frequency input circuits RFIL, RFIM or RFIH. In the latter case, the radio-frequency signal Si(RF) is processed by the radio frequency input circuit RFIL for the VHF-low band. The relevant radio-frequency input circuit supplies a suitably processed radio-frequency signal Sp(RF) to the mixer MIX in the integrated circuit MOIC in all cases.

The radio-frequency input circuits RFIL, RFIM and RFIH comprise tunable bandpass filters which are not shown for simplicity's sake. Tuning voltages VT which control the tunable bandpass filters are obtained as follows. Control data CON, which comprises information on the desired radio-frequency, effectively selects which tuning data TD is read from the memory MEM for supply to the digital-to-analog converter arrangement DAC. The selected tuning data TD is such that the digital-to-analog conversion arrangement DAC provides the tuning voltages VT for which the relevant radio-frequency input circuits processes the desired radio-frequency signal Si(RF) in the correct manner. Accordingly, with appropriate tuning data stored in the memory MEM, the bandpass filters can be satisfactorily tuned throughout the VHF-low, VHF-high and UHF bands. Any aberrations in the tuning of the bandpass filters relative to each other may be reduced by means of a manual adjustment.

The mixer MIX in the integrated circuit MOIC effectively multiplies the suitably processed radio-frequency signal Sp(RF) by a mixing signal Smix having a mixing frequency Fmix. In principle, the mixing frequency may either be the sum or the difference of the radio-frequency of the desired station and a desired intermediate frequency. For the FIG. 8 receiver, the mixing frequency is the sum. The desired intermediate frequency is, say, 10.7 MHz in the case of FM-radio reception and, say, 40 MHz in the case of TV-reception. To give an example, if reception is desired of a TV station having a 210 MHz radio-frequency, the mixing frequency will have to be 250 MHz. To give another example, if reception is desired of a FM-radio station having an 89.3 Mhz radio frequency, the mixing frequency will have to be 100 MHz.

The mixing signal Smix having the mixing frequency Fmix is obtained as follows. The oscillator OSC provides an oscillation signal Sosc at an oscillation frequency Fosc which may vary in a range between 1000 MHz and 2000 Mhz. The oscillation frequency Fosc is controlled by the phase-lock loop circuit PLL in accordance with the control data CON and on the basis of the reference frequency Fref which is, for example, 4 MHz. The frequency divider DIV divides the oscillation signal Sosc by an adjustable frequency division factor N so as to obtain the mixing signal Smix. The adjustable division factor N may be any of the following values: 2,3,4,6,8,12 or 16. Thus the FIG. 6 frequency diagram applies to both tuners TUN1, TUN2 of the FIG. 8 receiver. To give an example, there are three options for setting the mixing frequency to 250 Mhz. The first option is Fosc=1000 MHz and N=4, the second option is Fosc= 1500 MHz and N=6, and the third option is Fosc=2000 MHz and N=8.

The following remarks are made with respect to the FIG. 8 receiver. There is no fixed relation between the oscillation frequency Fosc and bandpass filter centre frequencies in the radio-frequency input circuits RFIL, RFIM, RFIH. For example, if reception of a TV station having a radio frequency of 210 Mhz is desired, the bandpass filters in the relevant radio-frequency input circuit will have be tuned to that radio frequency, whereas the oscillation frequency may either be 1000 MHz, 1500 MHz or 2000 MHz. It would be rather complicated, and accordingly costly, if the tuning voltages VT were derived from the tuning voltage applied to the oscillator OSC, because the division factor N is to be taken into account. Thus, the manner in which tuning voltages VT are generated in the FIG. 8 receiver is relatively cost-efficient.

Singapore patent applications 9600125.5, 9600123.5 and 9600124.3 corresponding to U.S. Pat. No. 6,044,251, issued Mar. 28, 2000, U.S. application Ser. No. 08/779,411, filed Jan. 7,1999, and U.S. Pat. No. 6,020,936, issued Feb. 1, 2000, describe features which may be optionally used to implement the FIG. 8 receiver to advantage. The aforementioned applications are included herein by reference, as well as any corresponding applications.

Figure 9:
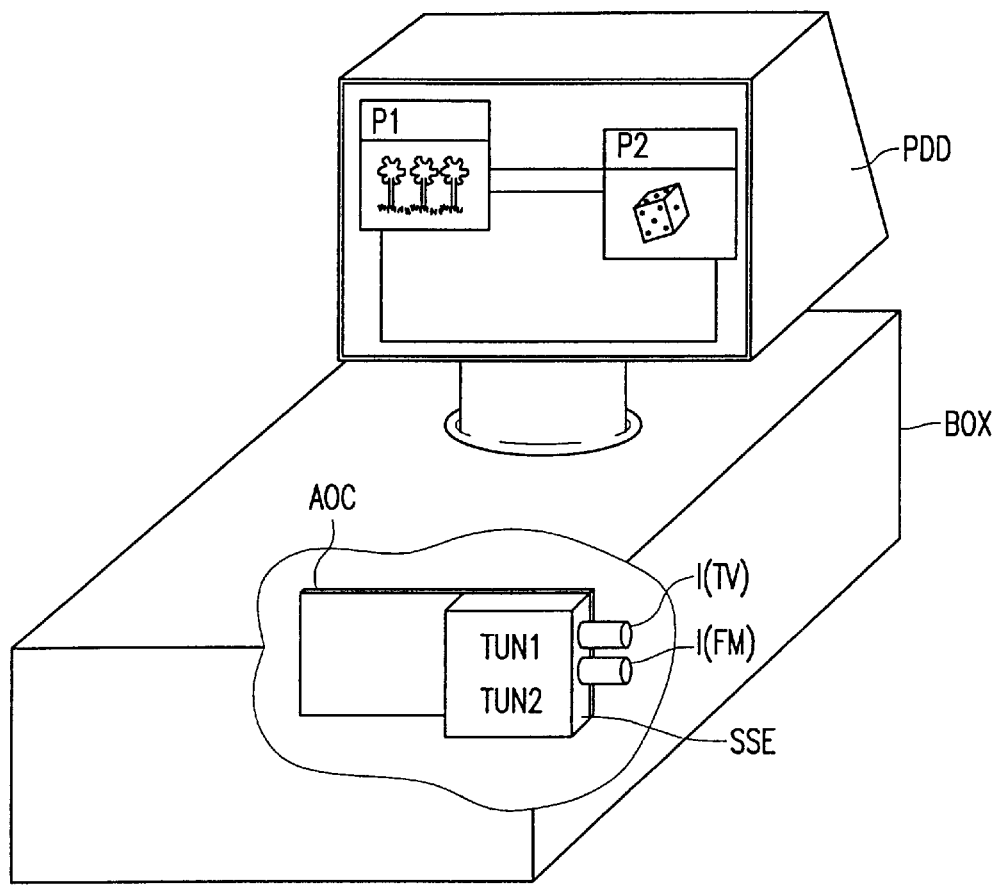
FIG. 9 is a diagram illustrating an example of a multimedia apparatus in accordance with the invention.

FIG. 9 shows an example of a multimedia apparatus in accordance with the invention. The FIG. 9 multimedia apparatus comprises a box BOX and a picture display device PDD. The box BOX houses various data processing circuits, not shown, and it houses an add-on card AOC with two tuners TUN1,TUN2 which are placed in a single shielded encasing SSE. The two tuners TUN1,TUN2 have radio frequency inlets I(TV) and I(FM) for receiving TV stations and FM-radio stations, respectively. The two times TUN1, TUN2 may be implemented, for example, as shown in FIG. 8. The two tuners TUN1,TUN2 allow of a concurrent display of, for example, two mutually different TV stations P1 and P2. Software for controlling the two tuners TUN1, TUN2 may be loaded into any type of memory which forms part of the multimedia device. Such software may be used, for example, to select an appropriate division factor for any frequency divider DIV which is included in either of the two tuners TUN1 or TUN2 as shown in FIG. 8, for example.

The drawings and the above description thereof illustrate rather than limit the invention. Evidently, there are numerous alternatives which fall within the scope of the appended claims. The following closing remarks may be made in that respect.

There are numerous ways of spreading functions or functional elements physically over various units. The drawings are highly diagrammatic in that regard and represent only one possible embodiment of the invention. Furthermore, the invention may be implemented by means of hardware comprising several distinct elements and, at least partly, by means of a suitably programmed computer.

Although the invention can be used to great advantage in multimedia apparatuses, applications in other types of apparatuses are by no means excluded. The invention may also be used to great advantage in, for example, TV sets, video tape recorders (VCRs) and in TV/VCR combinations. The invention may allow such apparatuses to have features like, for example, PIP, Split Screen and separate Teletext.

While examples were given of TV and FM-radio reception, other types of reception are by no means excluded. The invention may also be used for reception of, for example, broadband datacast.

While examples were given of two merged tuners, more than two tuners may be merged into one module. In the latter case, it would be preferable if there were a greater choice in oscillation frequencies than illustrated in FIG. 6. This may be accomplished, for example, by providing more mutually different division factors or by increasing the oscillation frequency range, or both.

While examples were given of binary and non-binary division factors, like 2,4,8,16 and 3,6,12, respectively, fractional division factors, like 1.5, may also be used. In the latter case, a filter is preferably coupled between the divider and the mixer. Fractional dividers generally provide signals having relatively asymmetrical duty cycles. As a result, mixer performance in terms of noise and signal handling may be degraded. The filter will reduce any asymmetry in duty cycles and consequently will counter such degradation.

Any reference symbols in parentheses shall not be construed as limiting the claim in which they occur.

What is claimed is:

1. A receiver comprising at least two tuners for concurrent reception of mutually different signals, and with the at least two tuners merged into one module, wherein said two tuners each have an oscillator coupled to a respective mixer for converting a signal at a radio frequency to an intermediate frequency, and the oscillator of each of the two tuners has an oscillation frequency (Fosc1 or Fosc2) which does not coincide with the radio frequency (RF2 or RF1), or any sub-harmonic of the radio frequency, of the signal received by the respective other tuner.

2. A receiver as claimed in claim 1, wherein the oscillation frequency (Fosc1 or Fosc2) in at least one of the two tuners exceeds the highest possible radio frequency (RFmax2 or RFmax1) which the respective other tuner is capable of receiving.

3. A receiver as claimed in claim 1, wherein the difference (ΔFosc) between the oscillation frequencies (Fosc1,Fosc2) in the two tuners exceeds an intermediate frequency bandwidth (BWIF) of the receiver.

4. A receiver as claimed in claim 2, wherein at least one of the two tuners has a frequency divider which is coupled between its respective oscillator and its respective mixer.

5. A receiver as claimed in claim 4, wherein the frequency divider has an adjustable division factor (N).

6. A receiver as claimed in claim 4, wherein the mixer and the frequency divider form a part of an integrated circuit.

7. An add-on card (AOC) suitable for forming part of a multimedia apparatus, the add-on card comprising a receiver as claimed in claim 2.

8. A receiver comprising first and second tuners for concurrent reception of mutually different signals, each of the first and second tuners having an oscillator coupled to a respective mixer for converting a signal at a radio frequency to an intermediate frequency, and wherein the oscillator of each of the first and second tuners has an oscillation frequency (Fosc1 or Fosc2) which does not coincide with the radio frequency (RF2 or RF1), or any sub-harmonic of the radio frequency, of the signal received by the respective other tuner.

9. A single shielded encasing comprising a receiver with at least two tuners as claimed in claim 8 for concurrent reception of mutually different signals.

10. A receiver as claimed in claim 8 wherein each of the two tuners comprise at least first and second radio frequency input circuits each including a tunable bandpass filter, the receiver further comprising;

a common memory for storing tuning data for the first and second radio frequency input circuits, first and second digital/analog converters for deriving first and second tuning voltages for the first and second radio frequency input circuits, respectively, said first and second digital/analog converters being controlled by the tuning data stored in the common memory.

11. A receiver as claimed in claim 8 wherein the oscillation frequency of the oscillator of the first tuner exceeds the highest radio frequency which the second tuner will receive.

12. A receiver as claimed in claim 11 wherein the oscillation frequency of the oscillator of the second tuner exceeds the highest radio frequency which the first tuner will receive.

13. A receiver as claimed in claim 8 wherein a difference frequency between the oscillation frequencies of the respective oscillators in the first and second tuners exceeds an intermediate frequency bandwidth of the receiver.

14. A receiver as claimed in claim 8 further comprising an adjustable frequency divider coupled between the oscillator and mixer of at least one of said first and second tuners.

15. A receiver as claimed in claim 8 wherein the first and second tuners operate in parallel between receiver input terminals and low frequency stages of the receiver.

16. A method of concurrently receiving mutually different signals by means of at least two tuners, each of the at least two tuners having an oscillator coupled to a mixer for converting a signal at a radio frequency to an intermediate frequency, said method comprising the step of operating the oscillator of each of the at least two tuners at an oscillation frequency (Fosc1 or Fosc2) which does not coincide with the radio frequency (RF2 or RF1), or any sub-harmonic of the radio frequency, of the signal received by another of the at least two tuners.

* * * * *